(12) United States Patent
Choudhury et al.

(10) Patent No.: US 8,467,737 B2
(45) Date of Patent: Jun. 18, 2013

(54) INTEGRATED ARRAY TRANSMIT/RECEIVE MODULE

(75) Inventors: Debabani Choudhury, Thousand Oaks, CA (US); Mark Ruberto, Haifa (IL)

(73) Assignee: Intel Corporation, Santa Clara, CA (US)

( * ) Notice: Subject to any disclaimer, the term of this patent is extended or adjusted under 35 U.S.C. 154(b) by 512 days.

(21) Appl. No.: 12/347,915

(22) Filed: Dec. 31, 2008

(65) Prior Publication Data

US 2010/0167666 A1  Jul. 1, 2010

(51) Int. Cl.
  *H04B 1/38* (2006.01)
(52) U.S. Cl.
  USPC ............................................. 455/73; 342/368
(58) Field of Classification Search
  USPC ..................... 455/73; 342/368, 371, 372, 377
  See application file for complete search history.

(56) References Cited

U.S. PATENT DOCUMENTS

| | | | |
|---|---|---|---|
| 4,967,201 A | 10/1990 | Rich, III | |
| 5,262,794 A | 11/1993 | Hegazi et al. | |
| 5,846,204 A | 12/1998 | Solomon | |
| 6,512,431 B2 * | 1/2003 | Pergande | 333/246 |
| 6,535,168 B1 | 3/2003 | Marumoto et al. | |
| 6,690,324 B2 * | 2/2004 | Vail et al. | 342/372 |
| 6,713,854 B1 | 3/2004 | Kledzik et al. | |
| 6,885,561 B1 | 4/2005 | Hashemi et al. | |
| 7,830,312 B2 | 11/2010 | Choudhury et al. | |
| 7,852,281 B2 | 12/2010 | Choudhury | |
| 2002/0131237 A1 | 9/2002 | Snyder et al. | |
| 2003/0043071 A1 | 3/2003 | Lilly et al. | |
| 2003/0150641 A1 | 8/2003 | Kinayman et al. | |
| 2003/0174479 A1 | 9/2003 | Shimura et al. | |
| 2004/0056803 A1 | 3/2004 | Soutiaguine et al. | |
| 2005/0190017 A1 | 9/2005 | Hirabayashi | |
| 2006/0164308 A1 | 7/2006 | Cohen | |
| 2007/0217175 A1 | 9/2007 | Young et al. | |
| 2008/0277778 A1 | 11/2008 | Furman et al. | |
| 2010/0164783 A1 | 7/2010 | Choudhury et al. | |

FOREIGN PATENT DOCUMENTS

| | | |
|---|---|---|
| CN | 1507767 A | 6/2004 |
| JP | 2003-204211 A | 7/2003 |
| JP | 2004-080159 A | 3/2004 |
| JP | 2006-500821 A | 1/2006 |

(Continued)

OTHER PUBLICATIONS

International Search Report and Written Opinion received for PCT Patent Application No. PCT/US2009/069442, mailed on Aug. 16, 2010, 8 pages.

(Continued)

*Primary Examiner* — Lincoln Donovan
*Assistant Examiner* — Diana J Cheng
(74) *Attorney, Agent, or Firm* — Sutherland Asbill & Brennan LLP

(57) ABSTRACT

Disclosed are integration approaches for mm-wave array type architectures using multilayer substrate technologies. For instance, an apparatus may include a first substrate layer, a second substrate layer, and a third substrate layer. The first substrate layer has a first plurality of array elements, and the second substrate layer has a second plurality of array elements. The third substrate layer has an integrated circuit to exchange one or more radio frequency (RF) signals with the first and second pluralities of array elements. The first and second substrate layers are separated by approximately a half wavelength ($\lambda/2$) corresponding to the one or more RF signals.

16 Claims, 7 Drawing Sheets

FOREIGN PATENT DOCUMENTS

| | | | |
|---|---|---|---|
| JP | 2007-068037 | A | 3/2007 |
| JP | 2007-306304 | A | 11/2007 |
| KR | 10-2006-0048432 | A | 5/2006 |
| WO | 2010/078199 | A2 | 7/2010 |
| WO | 2010/078215 | A2 | 7/2010 |
| WO | 2010/078199 | A3 | 10/2010 |
| WO | 2010/078215 | A3 | 10/2010 |

OTHER PUBLICATIONS

International Preliminary Report on Patentability received for PCT Patent Application No. PCT/US2009/069442, mailed on Jul. 14, 2011, 5 pages.

Office Action received for Chinese Patent Application No. 200911000101.4, mailed on Jun. 15, 2012, 6 pages of English Translation and 6 pages of Chinese Office Action.

Office Action received for U.S. Appl. No. 12/347,316, mailed on Aug. 5, 2011, 15 pages.

Office Action received for U.S. Appl. No. 12/347,316, mailed on Jul. 5, 2012, 13 pages.

Office Action received for U.S. Appl. No. 12/347,316, mailed on Apr. 17, 2012, 14 pages.

Choudhury, Debabani, "Sectorized, Millimeter-Wave Antenna Arrays With Optimizable Beam Coverage for Wireless Network Applications", U.S. Appl. No. 12/135,631, filed on Jun. 9, 2008, 15 pages.

Gaucher, et al., "MM-Wave Transceivers Using SiGe HBT Technology", 2004 Topical Meeting on Silicon Monolithic Integrated Circuits in RF Systems, IEEE, pp. 81-84.

Lee, et al., "A Highly Integrated 3-D Millimeter-Wave Filter Using LTCC System-on-Package (SOP) Technology for V-band WLAN Gigabit Wireless Systems'", APMC 2005 Proceedings, Dec. 4-7, 2005, 3 pages.

International Preliminary Report on Patentability and Written Opinion received for PCT Patent Application No. PCT/US2009/069516, mailed on Jul. 14, 2011, 6 pages.

International Search Report and Written Opinion received for PCT Patent Application No. PCT/US2009/069516, mailed on Aug. 16, 2010, 8 pages.

Tentzeris, et al., "3-D-Integrated RF and Millimeter-Wave Functions and Modules Using Liquid Crystal Polymer (LCP) System-on-Package Technology", IEEE trans. on Advanced packaging, vol. 27, No. 2, May 2004, pp. 332-340.

Office Action received for Taiwan Patent Application No. 98145017, mailed on Nov. 1, 2012, 1 page of Search Report and 7 pages of Taiwan Office Action.

Office Action received for European Patent Application No. 09837046.3, mailed on Aug. 25, 2011, 2 pages.

Office Action received for Korean Patent Application No. 10-2011-7015028, mailed on Oct. 10, 2012, 3 pages of English Translation Only.

Office Action received for Chinese Patent Application No. 200911000046.9, mailed on Nov. 2, 2012, 4 pages of English Translation, 2 pages of Search Report and 6 pages of Chinese Office Action.

Office Action received for European Patent Application No. 09837055.4, mailed on Aug. 30, 2011, 2 pages.

Office Action received for Korean Patent Application No. 10-2011-7015107, mailed on Oct. 10, 2012, 3 pages of English Translation only.

Office Action received for Chinese Patent Application No. 200911000101.4, mailed on Jan. 21, 2013, 3 pages of English Translation and 4 pages of Chinese Office Action.

Office Action received for Japanese Patent Application No. 2011-544515, mailed on Feb. 5, 2013, 3 pages of English Translation and 3 pages of Office Action.

Office Action received for U.S. Appl. No. 12/347,316, mailed on Mar. 18, 2013, 11 pages.

\* cited by examiner

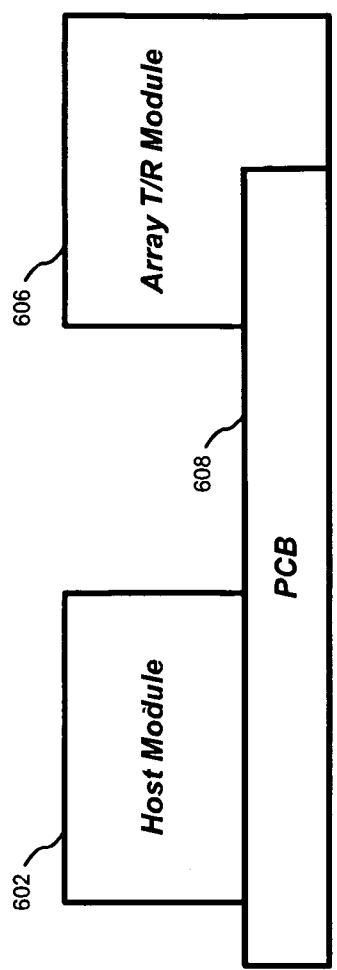

INTEGRATED ARRAY TRANSMIT/RECEIVE MODULE

BACKGROUND

Technological developments permit digitization and compression of large amounts of voice, video, imaging, and data information. The need to transfer data between devices through wireless techniques requires the exchange of accurate data streams at high data rates.

An extremely high frequency (EHF) electromagnetic energy band with wavelengths between approximately 1 millimeter and 10 millimeters may be used to transfer large amounts of data wirelessly. The EHF band includes a 60 gigahertz (GHz) segment (or band) that is between 56 and 66 gigahertz (GHz). This band may be used for high data rate millimeter-wave (mm-wave) communications.

BRIEF DESCRIPTION OF THE DRAWINGS

In the drawings, like reference numbers generally indicate identical, functionally similar, and/or structurally similar elements. The drawing in which an element first appears is indicated by the leftmost digit(s) in the reference number. The present invention will be described with reference to the accompanying drawings, wherein:

FIGS. 6A and 6B are diagrams of exemplary device implementations.

DETAILED DESCRIPTION

Figure 1:
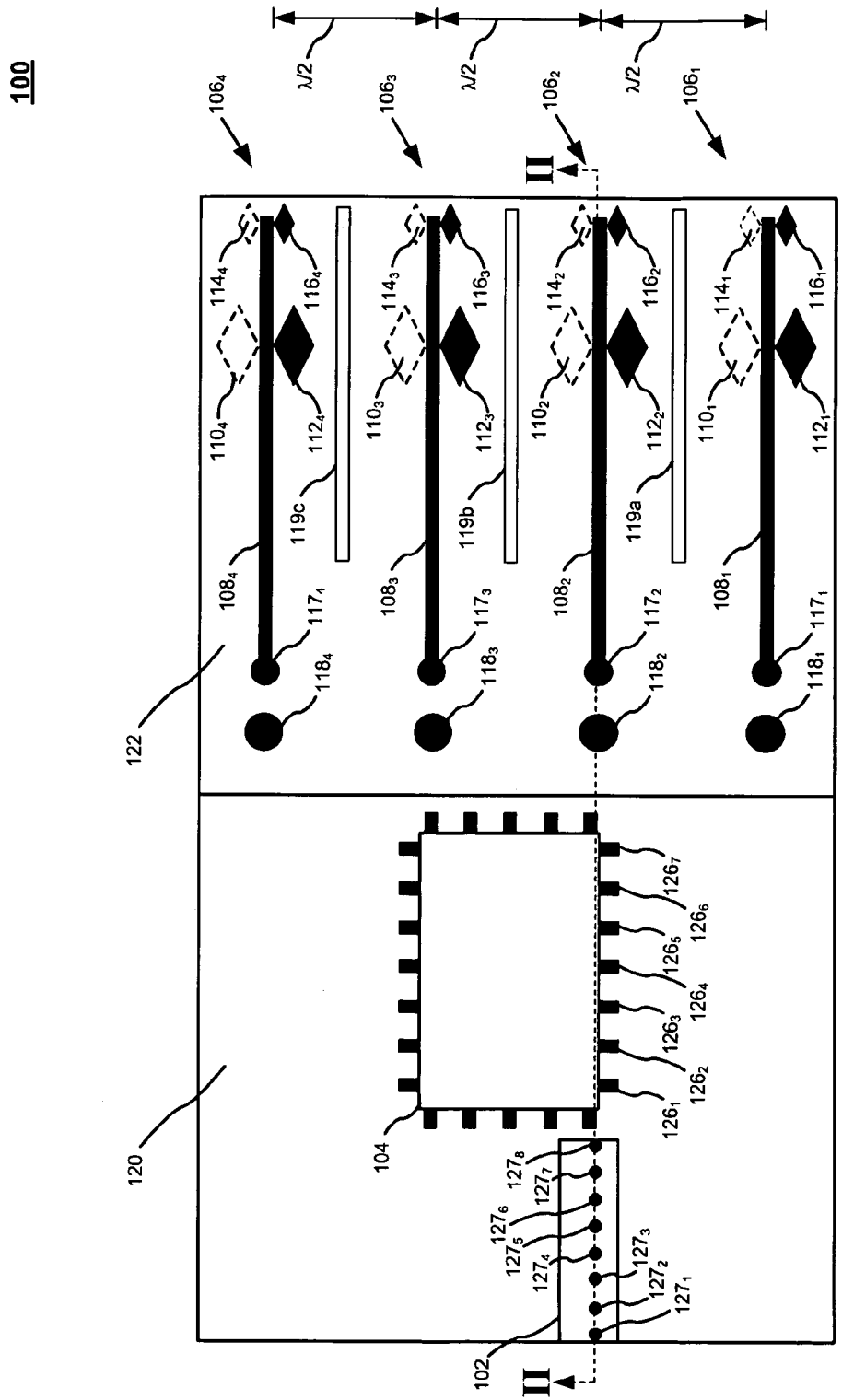
FIG. 1 is a top view of a array transmit and receive (T/R) module.

Embodiments provide a low-cost, integration approach for mm-wave array type architectures using multilayer substrate technologies. For instance, embodiments may provide an apparatus having a first substrate layer, a second substrate layer, and a third substrate layer. The first substrate layer has a first plurality of array elements, and the second substrate layer has a second plurality of array elements. The third substrate layer has an integrated circuit to exchange one or more radio frequency (RF) signals with the first and second pluralities of array elements. The first and second substrate layers are separated by approximately a half wavelength ($\lambda/2$) corresponding to the one or more RF signals.

Embodiments may advantageously include low cost, small form factor assemblies that provide integrated RF integrated circuit and antenna arrangements (e.g., end-fire array arrangements). These assemblies may be included in advanced millimeter wave communication system products. Moreover, these assemblies may be efficiently produced in high volumes.

Thus, embodiments may provide compact and easy to assemble, yet low cost millimeter wave wireless devices. Such devices may operate local area network (WLAN), wireless personal area network (WPAN), HDMI-type usage models, requiring high-data-rate transfer. For such applications, millimeter-wave communication using extremely high frequency radio signals is desirable because it provides relatively high communications throughput while allowing for high frequency reuse potential.

Existing millimeter wave communications techniques and systems employing waveguides and/or unshielded transmission structures fail to provide a compact yet low cost solution for communication devices using EHF radio signals. Unshielded transmission lines demonstrate quasi-transverse electromagnetic characteristics and suffer performance degradation when placed in close proximity to other structures in a compact packaging scenario. High performance waveguide structures, including plastic-based metallized structures, have been proposed for compact packaging. However, use of waveguides result in bulky structures in most designs.

Antennas designed to communicate using EHF radio signals with small wavelengths may be designed using small form factor packages due to small antenna profiles, allowing for a compact antenna array architecture. Embodiments provide low cost and compact antenna arrays capable of operating using mm-wave frequency radio signals, for example, in an unlicensed short range frequency band with data throughputs up to 5-10 gigabit per second.

This may advantageously enable more efficient form factor design of access point or consumer electronic and handheld devices while providing increased operability in a variety of applications. As a result, bulky antenna array systems inherent to existing antenna types may be avoided. Access points or devices employing extremely high frequency radio signals in a high bandwidth wireless communication environment may enjoy multidirectional wireless coverage from a low-cost, yet compact antenna array system.

Embodiments provide 60 GHz band (e.g., 56-66 GHz) millimeter-wave (mm-wave) communications devices that may be used in a variety of applications. Accordingly, embodiments may be used in conjunction with various devices and systems. Exemplary devices and systems include a transmitter, a receiver, a transceiver, a wireless communication station, a wireless communication device, a wireless Access Point (AP), a modem, a wireless modem, a Personal Computer (PC), a desktop computer, a mobile computer, a laptop computer, a notebook computer, a tablet computer, a server computer, a set-top box, a handheld computer, a handheld device, a Personal Digital Assistant (PDA) device, a handheld PDA device, a mobile station (MS), a graphics display, a communication station, and so forth.

Also, embodiments may be used in conjunction with various networks. Exemplary networks include wireless networks, local area networks (LANs), wireless LANs (WLANs), metropolitan area network (MANs), wireless MANs (WMANs), wide area networks (WANs), and wireless WANs (WWANs).

Additionally, embodiments may be used in conjunction with networks operating in accordance with existing IEEE 802.11, 802.11a, 802.11b, 802.11e, 802.11g, 802.11h, 802.11i, 802.11n, 802.16, 802.16d, 802.16e standards and/or future versions and/or derivatives and/or Long Term Evolution (LTE) of the above standards. Also, embodiments may be used in conjunction with personal area networks (PANs), wireless PANs (WPANs), one way and/or two-way radio communication systems, cellular radio-telephone communication systems.

Further, embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth®, ZigBee™, and/or the like.

The foregoing examples are provided for purposes of illustration and not limitation. Accordingly, embodiments may be used in various other apparatuses, devices, systems and/or networks.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a top view of a array transmit and receive (T/R) module 100. As shown in FIG. 1, T/R module 100 includes a connector module 102, an integrated circuit (IC) 104, and multiple array elements $106_1$-$106_4$. FIG. 1 shows four array elements for purposes of illustration, and not limitation. Accordingly, embodiments may employ any number of array elements in various patterns or arrangements.

Each of array elements $106_1$-$106_4$ are composed of a conductive material that is disposed on one or more surfaces. In addition, FIG. 1 shows that array elements $106_1$-$106_4$ being spaced apart at half wavelength ($\lambda/2$) intervals. However, other spacings may be employed. Vias $117_1$-$117_4$ provide array elements $106_1$-$106_4$, respectively, with electrical contact beneath surface 122.

Array elements $106_1$-$106_4$ may each include one or more conductive patterns on surface 122 that are also in contact with a conductive line on surface 122. For example, FIG. 1 shows array element $106_1$ including patterns $110_1$, $112_1$, $114_1$, and $116_1$, and a conductive line $108_1$; array element $106_2$ including patterns $110_2$, $112_2$, $114_2$, and $116_2$, and a conductive line $108_2$; array element $106_3$ including patterns $110_3$, $112_3$, $114_3$, and $116_3$, and a conductive line $108_3$; and array element $106_4$ including patterns $110_4$, $112_4$, $114_4$, and $116_4$, and a conductive line $108_4$. As an example, FIG. 1 shows such patterns as diamond shapes. However, other shapes may be employed. Moreover, patterns having other sizes and/or positions may be employed.

Also, FIG. 1 shows array elements including further conductive patterns. For example FIG. 1 shows array element $106_1$ including patterns $110_1$ and $114_1$; array element $106_2$ including patterns $110_2$ and $114_2$; array element $106_3$ including patterns $110_3$, and $114_3$; and array element $106_4$ including patterns $110_4$ and $114_4$.

FIG. 1 shows conductive patterns $110_1$-$110_4$ and $114_1$-$114_4$ with dotted lines. These dotted lines indicate that these patterns are beneath surface 122. However, in embodiments, these patterns may alternatively be on surface 122.

As an example, FIG. 1 shows each of patterns 110-116 as diamond shapes. However, other shapes may be employed. Moreover, patterns having other sizes and/or positions may be employed.

Slots are placed between adjacent array elements. For example, FIG. 1 shows a slot 119a between array elements $106_1$ and $106_2$, a slot 119b between array elements $106_2$ and $106_3$, and a slot 119c between array elements $106_3$ and $106_4$. These slots may have various depths. In embodiments, the slots may go completely through array T/R module 100. These slots may be filled with various material(s). Alternatively, slots 119a-c may be empty (thus, providing air gaps).

Slots 119a-c provide shielding between stacked antenna elements. This feature may be employed to reduce coupling and increase antenna scan angles.

As described above, slots 119a-c may be filled with various materials. Exemplary materials include electromagnetic bandgap (EBG) type structures that reduce element-to-element mutual coupling in lateral directions. Embodiments, however, may employ other materials.

Although not shown, array T/R module 100 may include array elements on a bottom surface that is opposite to surface 122. In embodiments, a corresponding array element exists on this opposite surface for each of array elements $106_1$-$106_4$. Further, each of these corresponding array elements may be in alignment (having a same horizontal alignment). Also, each such pairing of corresponding array elements may have substantially the same size and shape. Embodiments, however, are not limited to these exemplary arrangements.

FIG. 1 shows connector module 102 and IC 104 being disposed on a surface 120. These elements are shown for purposes of illustration, and not limitation. Accordingly, other elements having different positions, shapes, sizes, and/or orientations may be employed.

Connector module 102 includes integrated socket contacts into which a flexible cable (not shown) may be plugged. For example, FIG. 1 shows an exemplary row of socket contacts $127_1$-$127_8$. These socket contacts are provided for purposes of illustration, and not limitation. Accordingly, embodiments may employ any number of socket contacts in any arrangement (e.g., in multiple row arrangements).

Through the employment of connector module 102, array T/R module 100 may advantageously avoid the use of printed circuit board (PCB) integration. As a result, size reductions may be achieved. Also, through this feature, array T/R module 100 may be directly integrated into platform environments having smaller form-factor requirements. Further, this feature may advantageously provide cost savings over PCB integrated approaches.

In embodiments, IC 104 is a mm-wave array front-end that amplifies and converts mm-wave signals to and/or from approximately 1-15 GHz frequencies for baseband and digital data. IC 104 may comprise a transceiver having amplifiers, filters, frequency converters and other integrated circuit components. However, IC 104 may provide further additional and/or alternative features. IC 104 includes multiple pads to provide electrical connections with other elements. For example, FIG. 1 shows pads $126_1$-$126_7$.

IC 104 may be formed from group III and IV semiconductor technology such as Gallium Arsenide (GaAs) and Indium Phosphide (InP). At mm-wave frequencies, GaAs and InP may provide highly integrated solutions. Alternately, IC 104 may be formed from Silicon Germanium (SiGe) or complimentary metal-oxide semiconductor (CMOS) silicon technology. However, other technologies may be employed. Although FIG. 1 shows a single integrated circuit (IC 104), embodiments may employ a plurality of integrated circuits in array T/R module 100.

Various techniques may be employed to attach connection module 102 and IC 104 to surfaces 120. Exemplary techniques include flip-chip (e.g., C4), adhesive bonding, wire bonding and so forth. Embodiments, however, are not limited to these exemplary techniques.

Figure 2:
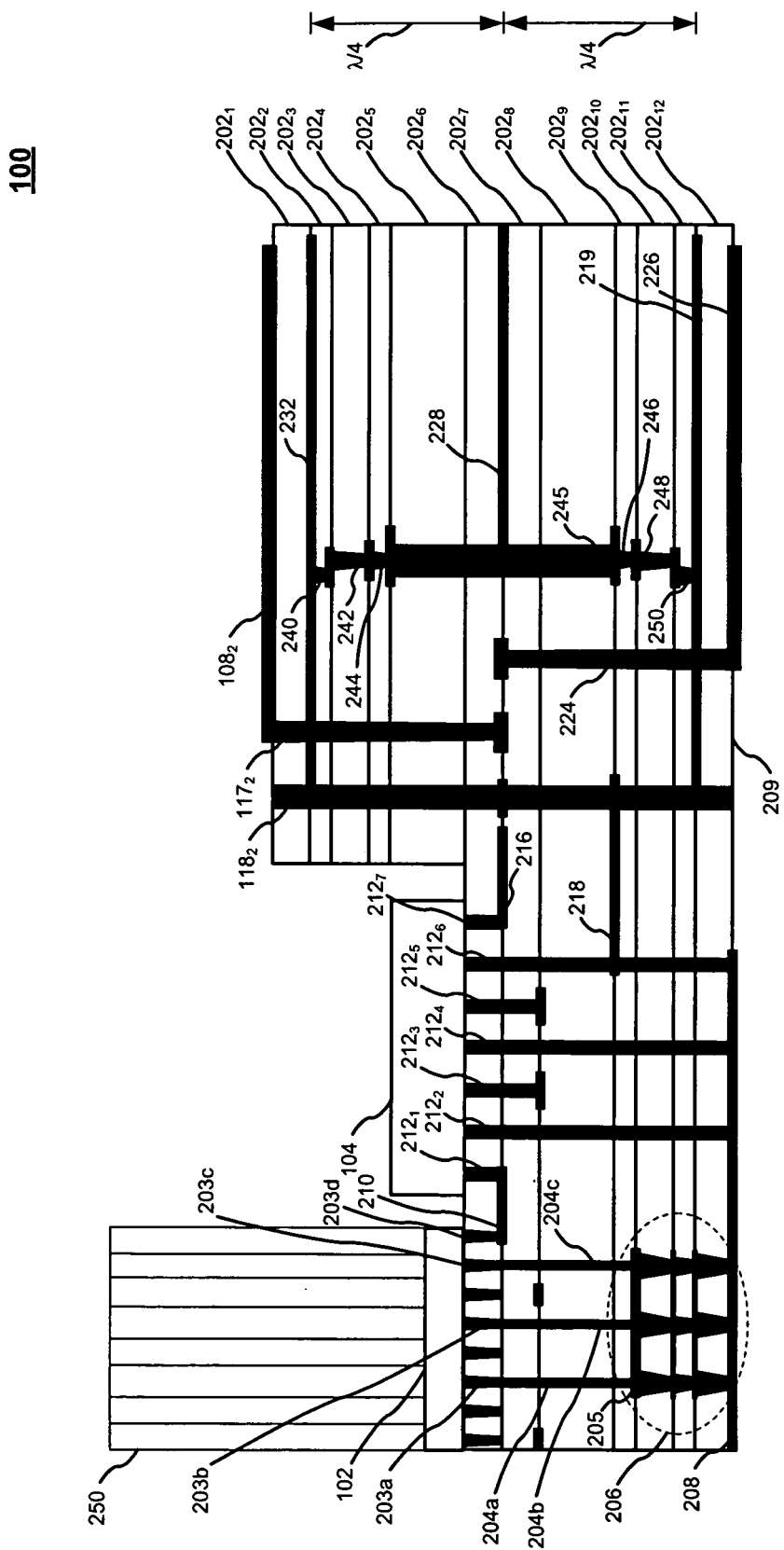
FIG. 2 is a cross-sectional side view of the T/R module shown in FIG. 1.

FIG. 2 is a cross-sectional side view of array T/R module 100. This view shows that T/R module 100 includes multiple substrate layers $202_1$-$202_{12}$. Although twelve layers are shown, embodiments may employ any number of layers.

Substrate layers $202_1$-$202_{12}$ may be composed of various materials. In embodiments, substrate layers $202_5$ and $202_8$ are composed of a first material, while the remaining substrate layers (i.e., $202_1$-$202_4$, $202_6$, $202_7$, and $202_9$-$202_{12}$) are composed of a second material. As an example, substrate layers $202_5$ and $202_8$ are composed of an organic laminate, and the remaining layers are composed of a polymer. Such polymer and laminate materials may have lower dielectric constant values that are suitable for antenna designs (e.g., 60 GHz antenna applications).

Exemplary laminate materials include Rogers Corporation RO-series material such as an RO-Series High Frequency Circuit Material comprising a woven glass reinforced/ceramic filled thermoset material with a very high glass transition temperature. Embodiments, however, are not limited to such materials.

Exemplary polymers include liquid crystal polymers (LCPs). Such LCPs may be high-performance, flexible, thin polymers in roll-to-roll materials, which typically have a lower cost than sheet materials. Alternatively, such LCPs may be high-performance bondply that can conform to any uneven surface to create a suitable structure. Although LCPs have different coefficients of thermal expansion (CTE) than Si-ICs, they conform to IC pads during assembly. The heat generated by ICs also helps soften the LCP bondply materials placed around the IC pads, which reduces reliability issues of CTE mismatch. The conformal properties of LCP also eliminate the need of any underfill of flip-chip ICs.

Connector module 102 and IC 104 are on surface 120, while array elements $106_1$-$106_4$ are on surface 122. FIG. 2 shows surface 120 being on substrate layer $202_6$, and surface 122 being on substrate surface 122. Thus, these surfaces may lie in different planes. However, in embodiments, these surfaces may be substantially coplanar.

As described above, array T/R module 100 may include array elements on a bottom surface 209 that is opposite to surface 122. For example, FIG. 2 shows a conductive pattern 226 on a surface of layer $202_{12}$ that is part of such an array element. This element corresponds to (and is in horizontal alignment with) array element $106_2$.

Also, as described above, array elements may include patterns at multiple layers. For example FIG. 1 shows patterns $110_1$-$110_4$ and $114_1$-$114_4$. These patterns may be disposed beneath surface 122. As an example, FIG. 2 shows a conductive pattern 232 on substrate layer $202_2$ that provides a connection to patterns $110_1$-$110_4$ and $114_1$-$114_4$ (which may also be on substrate layer $202_2$). Also, FIG. 2 shows a conductive pattern 219 that provides a connection to similar patterns on substrate layer $202_{11}$.

Through these array elements, array T/R module 100 provides a 4×2 array arrangement. As stated above, this arrangement is provided for purposes of illustration, and not limitation. Thus, embodiments may provide M×N array arrangements, where M is the number of elements in each layer and N is the number of element layers. Embodiments may employ any combination of values for M and N. Such arrangements may be operated as phased arrays and/or sets of switchable arrays (e.g., for beam steering).

Array T/R module provides shielding between layers of array elements. For instance, FIG. 2 shows a conductive pattern 228 on substrate layer $202_7$. These patterns may have surface shapes and/or sizes that correspond to (e.g., are substantially similar to) the surface patterns of the adjacent array elements.

For example, conductive pattern 228 may have shapes and/or sizes corresponding to that of array element $106_2$, and/or the array element of conductive patterns 226 and 219. Embodiments, however, may employ other arrangements.

For example, conductive patterns 232, 219, and/or 228 may extend substantially from slots 119a and 119b.

As described above, conductive pattern 228 provides shielding between array elements. This shielding may be through setting this patterns to a fixed potential (e.g., ground or a DC voltage level). Accordingly, this potential may be selected to provide suitable beam steering.

In embodiments, array element layers are spaced apart by a distance that is substantially a half wavelength ($\lambda/2$). Moreover, FIG. 2 shows that the top and bottom array element layers (e.g., array element $106_2$ and its corresponding element of layers $202_{11}$ and $202_{12}$ are spaced from conductive pattern 228 by a quarter wavelength ($\lambda/4$).

As described above, IC 104 includes pads (e.g., pads $126_1$-$126_7$). These pads, which are composed of a conductive material, each provide for electrical connections to other elements. Accordingly, FIG. 2 shows vias $212_1$-$212_7$, which are connected to pads $126_1$-$126_7$, respectively. Also, connector module 102 includes socket contacts (e.g., socket contacts $127_1$-$127_8$). These contacts are connected to vias in substrate layer $202_7$. For instance, FIG. 2 shows that socket contacts $127_3$, $127_5$, $127_7$, and $127_8$ are connected to vias 203a, 203b, 203c, and 203d, respectively.

In general operation, array T/R module 100 may exchange wireless signals with remote devices through its array elements. Additionally, array T/R module 100 may exchange signals with other devices through a flexible cable 250. In embodiments, flexible cable 250 may be a conventional "flex cable" that (through multiple conductors) conveys, RF, IF, analog, digital, DC signals, ground, and/or other types of signals. As described above, connector module 102 includes integrated socket contacts into which flexible cable 250 may be plugged. Each of these sockets provides an electrical contact for a corresponding conductor within flexible cable 250.

For instance, in the transmission of wireless signals, connector module 102 receives baseband or intermediate frequency (IF) signals or RF signals and DC/power signals from flexible cable 250. In turn, connector module 102 provides such signals to IC 104. As an example, connector module 206 may provide a baseband, IF, or RF signal to pad $126_1$ of IC 104 through a connection comprising via 202d, a conductive line 210, and a via $212_1$.

From this signal, IC 104 generates mm-wave signals. For instance, IC 104 may generate a mm-wave signal at pad $126_7$ that is sent across a via $212_7$ to a conductive pattern 216. Conductive pattern 216 is routed around via $118_2$ to connect to via $117_2$ between layers $202_6$ and $202_7$. In turn, these vias provide the mm wave signal to array element $106_2$ and the array element of conductive pattern 226. Although not shown, IC 104 generates a similar mm-wave signal that is routed to a via 224 between layers $202_6$ and $202_7$. In turn, vias $117_2$ and 524 provide their mm wave signal to array element $106_2$, and the array element of conductive pattern 226, respectively.

Conversely, these array elements may receive mm-wave wireless signals and provide them to IC 104 along the same routes. In turn, IC 104 generates a corresponding RF, IF or baseband signal, which is sent to connector module 102 by conductive pattern 210. Connector module 206 then provides this signal to flexible cable 250.

In addition, array T/R module 100 provides shielding features. For instance, various conductive patterns may be grounded (or maintained at particular DC voltage levels) through such ground or DC voltage signals that connector module 102 receives from flexible cable 250. For example, FIG. 2 shows vias 203a, 203b, and 203c providing connections multiple conductive patterns.

Such conductive patterns include a conductive pattern 208 on substrate layer $202_{12}$. As shown in FIG. 2, connection to pattern 208 may be provided through a conductive pattern 205 and multiple vias 206.

From conductive pattern 208, such ground or DC voltage levels may be distributed throughout array T/R module 100. For example, FIG. 2 shows vias $212_2$, $212_4$, and $212_6$ providing connections to IC 104 at pads $126_2$, $126_4$, and $126_6$, respectively.

Also, FIG. 2 shows via $212_6$ providing a connection to a conductive pattern 218 that is on substrate layer $202_9$. Conductive pattern 218 contacts via $118_2$. In turn, via $118_2$ contacts conductive patterns 219 and 232. Also, through multiple vias (240, 242, 244, 245, 246, 248, and 250) contact is provided to a conductive pattern 228. As shown in FIG. 2, conductive pattern 228 is on substrate layer $202_7$.

Although not shown, array T/R module 100 may include a heat sink layer to dissipate heat that it generates. The heat sink layer may be attached in various ways. For example, it may be attached to layer $202_{12}$. However, embodiments may employ other arrangements. The heat sink layer may be composed of various material(s) suitable for the dissipation of heat and reliable operation.

Figure 3:
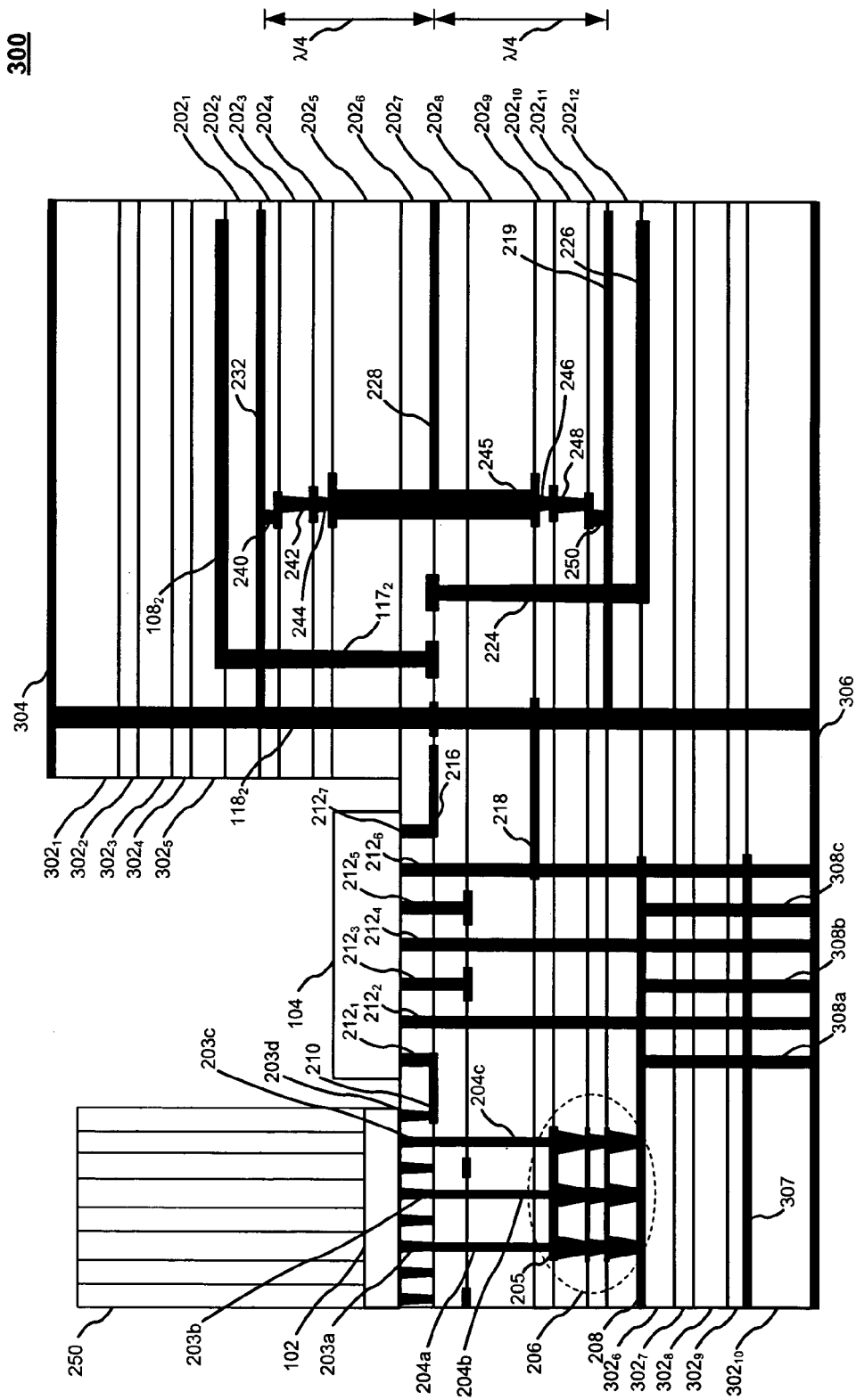
FIG. 3 is a cross-sectional-side view of a further array T/R module.

FIG. 3 is a cross-sectional side view of a further array T/R module 300. Module 300 may be implemented as module 100 of FIGS. 1 and 2. However, FIG. 3 shows that array T/R module 300 includes further outer substrate layers.

In particular, FIG. 3 shows substrate layers $302_1$-$302_{10}$. These layers may be implemented as described above with reference to FIG. 2. For instance, layers $302_1$ and $302_{10}$ may each be composed of an organic laminate while layers $302_2$-$302_8$ may each be composed of a polymer. However, other compositions may be employed.

Array T/R module 300 provides additional shielding features. In particular, FIG. 3 shows a conductive pattern 304 on substrate layer $302_1$, and a conductive pattern 306 on substrate layer $302_{10}$. These patterns may have similar shapes and/or sizes as conductive patterns 232, 228, and/or 219. In embodiments, conductive patterns 304 and 306 are separated from array elements $106_2$ and the array element of conductive pattern 226, respectively, by a quarter wavelength ($\lambda/4$). However, other distances may be employed.

Contact with these patterns is established through various ways. For instance, FIG. 3 shows vias $118_2$, $212_2$, $212_4$, and $212_6$ being extended. Also, FIG. 3 shows a conductive pattern 307 and vias 308a-308c.

Although not shown, array T/R module 100 may include a heat sink layer to dissipate heat that it generates. The heat sink layer may be attached in various ways. For example, it may be attached to layer $302_{10}$. However, embodiments may employ other arrangements. The heat sink layer may be composed of various material(s) suitable for the dissipation of heat and reliable operation.

Embodiments, such as array modules 100 and 300, may be attached to or integrated with printed circuit boards (PCB). An example of such an implementation is shown in FIGS. 4 and 5.

Figure 4:
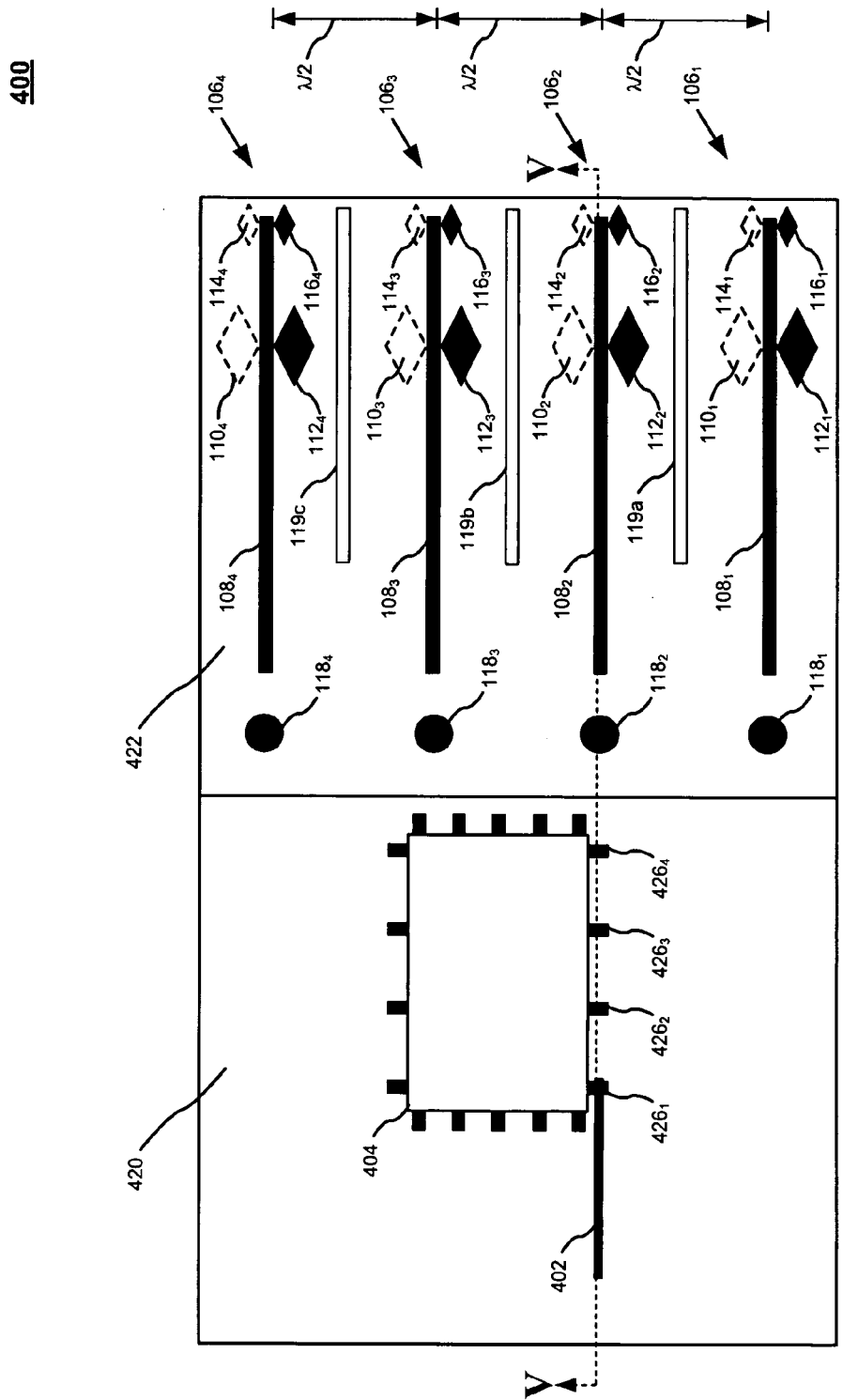
FIG. 4 is a top view of yet a further array T/R module.
Figure 5:
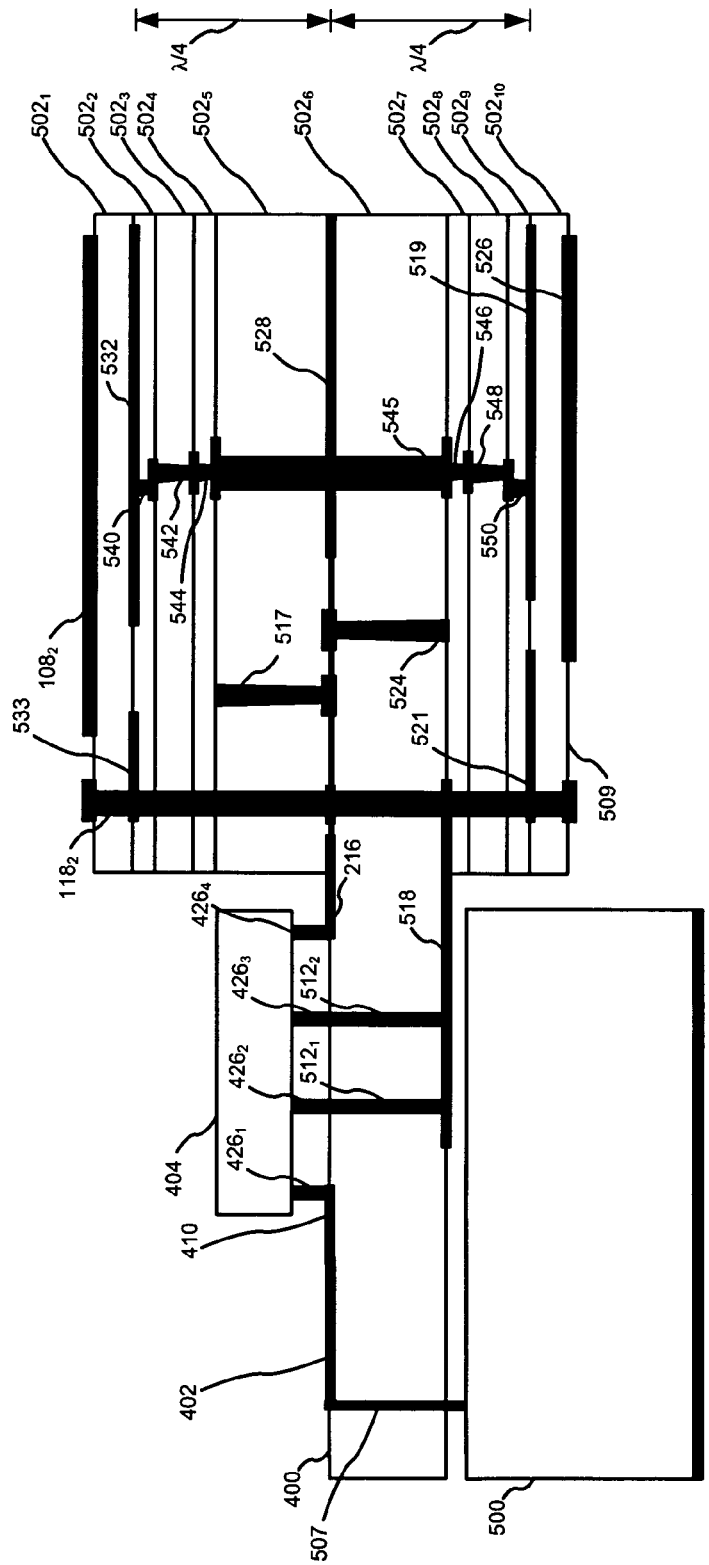
FIG. 5 is a cross-sectional side view of the T/R module shown in FIG. 4.

FIG. 4 is a top view of yet a further array T/R module 400. This module is similar to module 100 of FIGS. 1 and 2. For instance, array T/R module 400 includes multiple array elements $106_1$-$106_4$, as well as slots 119a-119c, on a surface 422. Also, FIG. 4 shows an integrated circuit (IC) 404 on a surface 420. FIG. 4 shows four array elements for purposes of illustration, and not limitation. Accordingly, embodiments may employ any number of array elements in various patterns or arrangements.

Each of array elements $106_1$-$106_4$ and slots 119a-c are implemented as described above with reference to FIGS. 1 and 2. However, unlike T/R module 100, T/R module 400 of FIG. 4 does not include vias $117_1$-$117_4$. Instead, connections to these elements are provided through electromagnetic coupling techniques. Details regarding such techniques are provided below with reference to FIG. 5.

As with module 100 of FIGS. 1 and 2, array T/R module 400 may include array elements on a bottom surface that is opposite to surface 422. These elements may be implemented in the manner described above.

In embodiments, IC 404 is a mm-wave array front-end that amplifies and converts mm-wave signals to and/or from approximately 1-15 GHz frequencies for baseband and digital data. IC 404 may comprise a transceiver having amplifiers, filters, frequency converters and other integrated circuit components. However, IC 404 may provide further additional and/or alternative features. IC 404 includes multiple pads to provide electrical connections with other elements. For example, FIG. 1 shows pads $426_1$-$426_4$. IC 404 may be implemented according to various technologies, such as those described above with reference to IC 104. Further, although FIG. 4 shows a single integrated circuit (IC 404), embodiments may employ a plurality of integrated circuits in array T/R module 400.

Various techniques may be employed to attach IC 404 to surface 420. Exemplary techniques include flip-chip (e.g., C4), adhesive bonding, wire bonding and so forth. Embodiments, however, are not limited to these exemplary techniques.

IC 404 may receive and provide signals through various connections. As an example, FIG. 4 shows IC 404 connected to a conductive line 402 on surface 420. Through conductive line 402, IC 404 may receive or provide baseband, IF, and/or RF signals. This line is provided for purposes of illustration. Accordingly, various additional and/or alternative connections may be provided.

FIG. 5 is a cross-sectional side view of array T/R module 400. This view shows that array T/R module 400 includes substrate layers $502_1$-$502_{10}$. Although ten layers are shown, embodiments may employ any number of layers. These layers may be implemented as described above with reference to FIG. 2. For instance, layers $502_5$ and $502_6$ may each be composed of an organic laminate while layers $502_1$-$502_4$ and $502_6$-$502_{10}$ may each be composed of a polymer. However, other compositions may be employed.

As shown in FIG. 5, array T/R module 400 may be attached to a PCB 500. This connection may be, for example, through adhesive and/or solder contacts. Embodiments, however, may employ other techniques. As described above, IC 404 is on surface 420, while array elements $106_1$-$106_4$ are on surface 422. FIG. 5 shows surface 220 being on substrate layer $502_5$, and surface 422 being on substrate surface $502_1$. Thus, these surfaces may lie in different planes. However, in embodiments, these surfaces may be substantially coplanar.

As described above, array T/R module 100 may include array elements on a bottom surface 509 that is opposite to surface 122. For example, FIG. 5 shows conductive pattern 526 on a surface of layer $502_{10}$ that is part of such an array element. In addition FIG. 5 shows a conductive pattern on 519 on layer $502_9$. These patterns corresponds to components of array element $106_2$. Moreover, these patterns may be in horizontal alignment with array element $106_2$.

Thus, the array elements of array T/R module 400 provides a 4×2 array arrangement. As stated above, this arrangement is provided for purposes of illustration, and not limitation. Thus, embodiments may provide M×N array arrangements, as described above. Embodiments may employ any combination of values for M and N. Such arrangements may be operated as phased arrays and/or sets of switchable arrays (e.g., for beam steering).

Array T/R 400 module provides shielding between layers of array elements. For instance, FIG. 5 shows conductive pattern 528 on substrate layer $502_6$. In the manner of T/R modules 100 and 300, these patterns may have surface shapes and/or sizes that correspond to (e.g., are substantially similar to) the patterns of the corresponding array elements. Embodiments, however, may employ other arrangements. For example, these conductive patterns may extend substantially from slots 119a and 119b.

Conductive pattern 528 provides shielding between array elements. This shielding may be through setting this pattern to a fixed potential (e.g., ground or a DC voltage level). Accordingly, this potential may be selected to provide suitable beam steering.

In embodiments, array element layers are spaced apart by a distance that is substantially a half wavelength ($\lambda/2$). Moreover, FIG. 5 shows that the array element layers of surfaces 422 and 509 are spaced from conductive pattern 528 by a quarter wavelength ($\lambda/4$).

As described above, IC 404 includes pads (e.g., pads $426_1$-$426_4$). These pads, which are composed of a conductive material, each provide for electrical connections to other elements. Accordingly, FIG. 5 shows vias $512_1$ and $512_2$, which are connected to pads $426_2$ and $426_3$, respectively. In turn, these vias provide contact with a conductive pattern 518 on substrate layer $502_7$.

In general operation, array T/R module 400 may exchange wireless signals with remote devices through its array elements. Additionally, array T/R module 400 may exchange signals with other devices through PCB 500. Such signals may be RF, IF, analog, digital, DC signals, ground, and/or other types of signals.

For instance, in the transmission of wireless signals, PCB 500 may provide IC 404 with baseband, intermediate frequency (IF) signals, RF signals, ground, and/or DC/power signals. For example, PCB, through a contact 205 (e.g., a solder connection) provides a baseband, IF, or RF signal to pad $426_1$ of IC 404 through a connection comprising a via 507, and conductive line 402.

From this signal, IC 404 generates a mm-wave signal. For instance, IC 404 may generate a mm-wave signal at pad $426_4$ that is sent across a conductive pattern 516. Conductive pattern 516 is routed around via $118_2$ to connect to via 517. Although not shown, IC 404 generates a similar mm-wave signal that is routed to a via 524.

In turn, vias 517 and 524 provides their mm wave signal to array element $106_2$, and the array element of conductive line 526, respectively. This may be done through electromagnetic coupling. For example, via 517 may couple its mm-wave signal to array element $106_2$ through a gap formed between conductive pattern 532 and a conductive pattern 513. Similarly, via 524 may couple it mm-wave signal to the array element of conductive pattern 526 through a gap formed between conductive pattern 519 and a conductive pattern 521.

Conversely, these array elements may receive mm-wave wireless signals and provide them to IC 404 along the same routes. In turn, IC 404 generates a corresponding RF, IF or baseband signal, which is sent to PCB 500 by conductive pattern 402 and via 507.

In addition, array T/R module 400 provides shielding features. For instance, various conductive patterns may be grounded (or maintained at particular DC voltage levels) through such ground or DC voltage signals that are received from IC 404 and/or PCB 500. For example, vias $512_1$ and $512_2$, may deliver such ground or DC voltage signals to conductive pattern 518.

From conductive pattern 518, such ground or DC voltage levels may be distributed throughout array T/R module 400. For example, FIG. 5 shows via $118_2$ providing connections to conductive patterns 533 and 521.

Also, FIG. 5 shows multiple vias (540, 542, 544, 545, 546, 548, and 550) contact that provide connections to is provided to conductive patterns 532, 528, and 519. These vias may receive such ground or DC voltage signals through various conductive patterns (not shown). Alternatively, conductive patterns 532 and 533 may contact each other. Similarly, conductive patterns 519 and 521 may contact each other. Embodiments are not limited to these exemplary signal routings Although not shown, array T/R module 400 may include a heat sink layer to dissipate heat that it generates. The heat sink layer may be attached in various ways. For example, it may be attached to PCB 500. However, embodiments may employ other arrangements. The heat sink layer may be composed of various material(s) suitable for the dissipation of heat and reliable operation.

The embodiments described herein provide examples of endfire M×N array arrangements. Such arrangements may be operated as arrays and/or sets of switchable arrays (e.g., for beam steering).

These arrangements are suitable in various devices. For example, array T/R modules, such as those described above with reference to FIGS. 1-5 may be implemented in laptop or notebook computers, as well as other platforms requiring steerable array antennas. For instance, multilayer, compact endfire arrays, such as described herein, may provide improved azimuth coverage, which is desirable for notebook-based wireless applications (e.g., WPAN type applications). Moreover, embodiments may provide array T/R modules that may fit within an add-on card or a minicard.

Figure 6A:
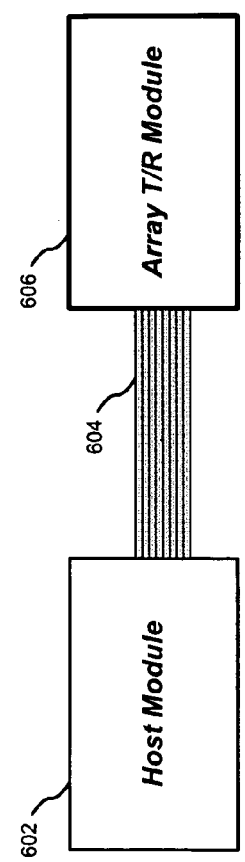

FIG. 6A is a diagram of an apparatus 600 that may employ array T/R module, such as module 100 or module 300. This apparatus may be included in various devices, such as access points, portable devices, and so forth. As shown in FIG. 6A, this device includes a host module 602 and array T/R module 606.

Host module 602 exchanges RF, IF or baseband signals with array T/R module 606. As shown in FIG. 6A, this exchange may be through a flexible cable 604. In turn, array T/R module 606 exchanges corresponding wireless signals (e.g., mm-wave signals) with remote devices.

Array T/R module 606 may be implemented in accordance with the techniques described herein. For example, array T/R module 606 may employ the implementations of FIGS. 1-3. However, other implementations may be employed.

The signals exchanged between host module 602 and array T/R module 606 may correspond to messages or information associated with one or more protocols, and/or with one or more user applications. Thus, host module 602 may perform operations corresponding to such protocol(s) and/or user application(s).

Exemplary protocols include various link control, media access control, network, transport and/or session layer protocols. Exemplary user applications include telephony, messaging, e-mail, web browsing, content (e.g., video and audio) distribution/reception, and so forth. Embodiments, however, are not limited to these examples.

Host module 602 may be implemented in various ways. For example, host module 602 may comprise one or more processors and a storage medium (e.g., memory). In embodiments, the processor(s) may execute instructions contained in the storage medium. Exemplary processors include microprocessors and digital signal processors. However other types of processors may be employed. Further, host module 602 may include hardware (e.g., circuitry) to convert between digital signals and/or data and the signals exchanged with array T/R module 100.

The storage medium may be a tangible medium. Examples include any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

FIG. 6B is a diagram of an apparatus 650 that is similar to the apparatus of FIG. 6A. However, instead of including a flexible cable 604, apparatus 650 includes a PCB 608 that couples host module to 602 array T/R module 606. In this arrangement, PCB 608 may provide physical attachment, as well as signal routing between modules 602 and 606.

Thus, in this context, array T/R module 606 may employ the implementation of FIGS. 4 and 5. For example, PCB 608 may be implemented with PCB 500. Embodiments, however, are not limited to this exemplary implementation.

While various embodiments of the present invention have been described above, it should be understood that they have been presented by way of example only, and not in limitation. Accordingly, it will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. An apparatus, comprising:
one or more first substrate layers having a first plurality of array elements;
one or more second substrate layers having a second plurality of array elements;
a third substrate layer;
an integrated circuit on the third substrate layer, the integrated circuit to exchange one or more radio frequency (RF) signals with the first and second pluralities of array elements; and
a connector module to exchange one or more further signals between the integrated circuit and a host module, the one or more further signals corresponding to the one or more RF signals;
wherein the first and second substrate layers are separated by approximately a half wavelength ($\lambda/2$) corresponding to the one or more RF signals.

2. The apparatus of claim 1, wherein the one or more RF signals are each millimeter-wave signals.

3. The apparatus of claim 1, wherein the connector module is configured to receive a flexible cable having one or more conductors, the flexible cable to convey the one or more further signals.

4. The apparatus of claim 1, wherein the third substrate layer is between the first and second substrate layers.

5. The apparatus of claim 1, further comprising a printed circuit board to exchange one or more further signals with the integrated circuit, the one or more further signals corresponding to the one or more RF signals.

6. The apparatus of claim 1, wherein the first and second pluralities of array elements includes pairs of corresponding array elements, each pair including a first array element from the first plurality and a second array element from the second plurality.

7. The apparatus of claim 1, wherein each of the pairs of corresponding array elements are in alignment.

8. The apparatus of claim 1, further comprising one or more slots arranged between the pairs of corresponding array elements.

9. The apparatus of claim 8, wherein each of the one or more slots comprises an electromagnetic bandgap (EBG) structure.

10. The apparatus of claim. 8, wherein each of the one or more slots comprises an air gap.

11. An apparatus, comprising
a host module; and
an array transmit and receive module;
wherein the array transmit and receive module includes;
one or more first substrate layers having a first plurality of array elements;
one or more second substrate layers having a second plurality of array elements;
a third substrate layer; and
an integrated circuit on the third substrate layer, the integrated circuit to exchange
one or more radio frequency (RF) signals with the first and second pluralities of array elements;
wherein the first and second substrate layers are separated by approximately half wavelength ($\lambda/2$) corresponding to the one or more RF signals,
wherein the host module and the array transmit and receive module are to exchange one or more further signals, the one or more further signals corresponding to the one or more RF signals, and
wherein the array transmit and receive module further comprises a connector module to exchange the one or more further signals between the integrated circuit and the host module.

12. The apparatus of claim 11, further comprising: a flexible cable coupled between the host module and the array transmit and receive module.

13. The apparatus of claim 11, further comprising a printed circuit board (PCB), wherein the PCB is coupled to the host module and the array transmit and receive module.

14. The apparatus of claim 13, wherein the PCB is to exchange the one or more further signals between the integrated circuit and the host module.

15. The apparatus of claim 11, wherein the one or more RE signals are each millimeter-wave signals.

16. The apparatus of claim 11, wherein the third substrate layer is between the one or more first substrate layers and the one or more second substrate layers.

\* \* \* \* \*